United States Patent
Chou et al.

(10) Patent No.: US 10,332,769 B2
(45) Date of Patent: Jun. 25, 2019

(54) SEMICONDUCTOR PROCESSING STATION, SEMICONDUCTOR PROCESS AND METHOD OF OPERATING SEMICONDUCTOR PROCESSING STATION

(71) Applicant: Taiwan Semiconductor Manufacturing Co., Ltd., Hsinchu (TW)

(72) Inventors: You-Hua Chou, Hsinchu (TW); Chih-Wei Huang, Hsinchu (TW); Kuo-Sheng Chuang, Hsinchu (TW); Cheng-Chung Chien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 271 days.

(21) Appl. No.: 14/996,231

(22) Filed: Jan. 15, 2016

(65) Prior Publication Data
US 2017/0207109 A1 Jul. 20, 2017

(51) Int. Cl.
*H01L 21/677* (2006.01)

(52) U.S. Cl.
CPC .. *H01L 21/67775* (2013.01); *H01L 21/67772* (2013.01)

(58) Field of Classification Search
CPC ........... H01L 21/67775; H01L 21/67773; H01L 21/67745; H01L 21/67748; H01L 21/67757; H01L 21/67778; H01L 21/67781; H01L 21/68707
See application file for complete search history.

(56) References Cited

U.S. PATENT DOCUMENTS

| | | | | |
|---|---|---|---|---|
| 5,391,035 A * | 2/1995 | Krueger | ............ | H01L 21/67748 414/217.1 |
| 5,431,600 A * | 7/1995 | Murata | ............. | H01L 21/67775 414/411 |
| 5,655,869 A * | 8/1997 | Scheler | ............. | H01L 21/67775 414/222.01 |
| 5,697,750 A * | 12/1997 | Fishkin | ............. | H01L 21/67757 414/217.1 |
| 5,752,796 A * | 5/1998 | Muka | ................ | H01L 21/67017 414/217.1 |
| 6,612,797 B1 * | 9/2003 | Bonora | ............... | G03F 7/70541 414/217 |
| 6,736,582 B1 * | 5/2004 | Mages | ............. | H01L 21/67772 414/217 |
| 8,851,819 B2 * | 10/2014 | Kamikawa | ........ | H01L 21/67727 414/222.07 |

(Continued)

*Primary Examiner* — Glenn F Myers
(74) *Attorney, Agent, or Firm* — JCIPRNET

(57) ABSTRACT

A semiconductor processing station comprises a platform and a load port, wherein the platform includes an intake/outtake port and a plurality of processing modules. The load port includes a load chamber, a movable cover and a carrier transfer module. The load chamber communicates with the intake/outtake port and has a load opening at its top end for receiving a transport carrier within the load chamber. The movable cover is disposed at the load opening and is configured to seal the load opening. The carrier transfer module is configured to transfer the transport carrier to the intake/outtake port. A semiconductor process and a method of operating a semiconductor processing station are also provided.

20 Claims, 11 Drawing Sheets

(56) References Cited

U.S. PATENT DOCUMENTS

| | | | |
|---|---|---|---|
| 2005/0095976 A1* | 5/2005 | Tzeng | H01L 21/67017 454/187 |
| 2007/0201967 A1* | 8/2007 | Bufano | H01L 21/67379 414/222.01 |
| 2016/0035596 A1* | 2/2016 | Kamiya | H01L 21/67775 414/225.01 |

* cited by examiner

SEMICONDUCTOR PROCESSING STATION, SEMICONDUCTOR PROCESS AND METHOD OF OPERATING SEMICONDUCTOR PROCESSING STATION

BACKGROUND

In recent years, the semiconductor processing station has been an important development in semiconductor manufacturing. Multiple substrates (e.g. wafers) are typically stored and transported together in batches by a transport carrier throughout a semiconductor fabrication facility ("fab") between load ports of different wafer processing tools or equipments. Such tools generally perform various photolithography, etching, material/film deposition, curing, annealing, inspection, or other processes used in IC chip manufacturing. One such transport carrier is a front opening unified pod (FOUP) which is a plastic enclosure designed to hold a plurality of substrates in a controlled environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
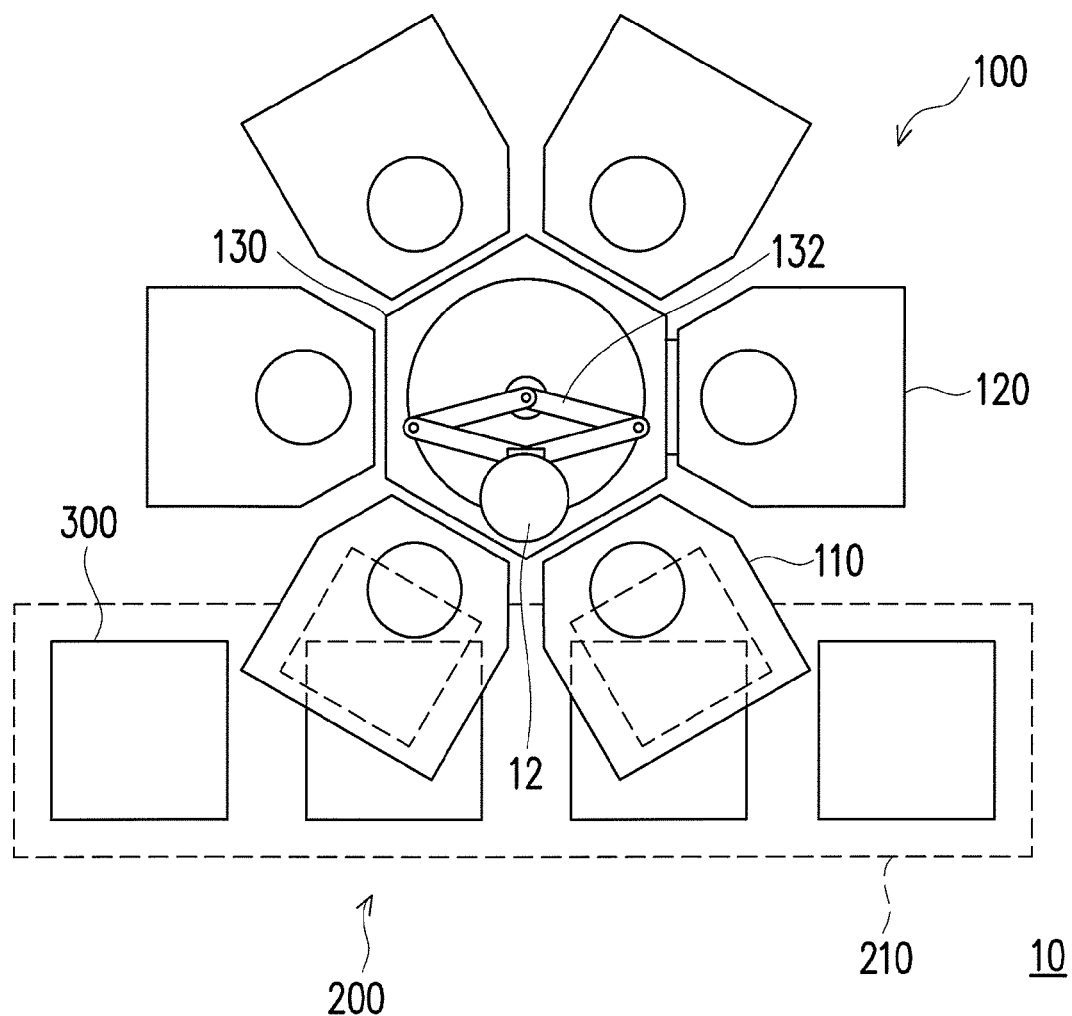
FIG. 1 is a schematic plan view of a semiconductor processing station according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
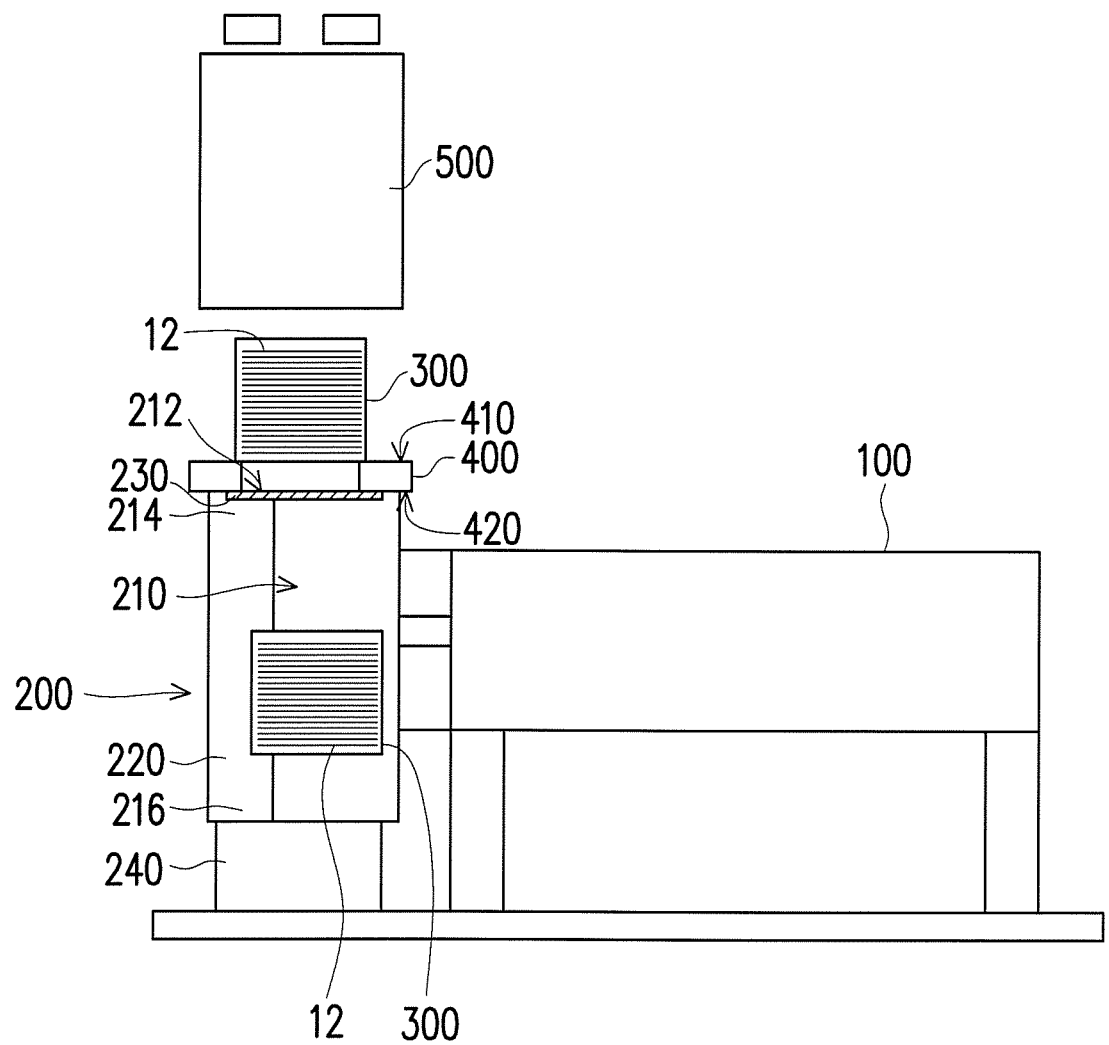
FIG. 2 is a schematic side view of the semiconductor processing station of FIG. 1 according to some embodiments of the present disclosure.

FIG. 1 is a schematic plan view of a semiconductor processing station according to some embodiments of the present disclosure. FIG. 2 is a schematic side view of the semiconductor processing station of FIG. 1 according to some embodiments of the present disclosure.

Referring to FIG. 1 and FIG. 2, a semiconductor processing station 10 is configured to process a substrate 12, such as a wafer. The substrate 12 may include one or more semiconductor, conductor, and/or insulator layers. The semiconductor layers may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the substrate 12 may include layered semiconductors. Examples include the layering of a semiconductor layer on an insulator such as that used to produce a silicon-on-insulator ("SOI") substrate, a silicon-on-sapphire substrate, or a silicon-germanium-on-insulator substrate, or the layering of a semiconductor on glass to produce a thin film transistor ("TFT").

The semiconductor processing station 10 includes a platform 100 and a load port 200. The platform 100 includes an intake/outtake port 110, a plurality of processing modules 120 and a central transfer module 130 with a central transfer mechanism 132. The intake/outtake port 110 and the plurality of processing modules 120 are arranged in the periphery of the central transfer module 130. This configuration allows the central transfer mechanism 132 to transport the substrate 12 between the processing modules 120 and the intake/outtake port 110.

The processing modules 120 may be configured to perform any manufacturing procedure on the substrate 12. Substrate manufacturing procedures include deposition processes such as physical vapor deposition ("PVD"), chemical vapor deposition ("CVD"), plasma-enhanced chemical vapor deposition ("PECVD"), electrochemical deposition ("ECD"), molecular beam epitaxy ("MBE"), atomic layer deposition ("ALD") and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the substrate 12; and/or any combination of procedures.

The area of the semiconductor processing station 10 defined by the platform 100 including the intake/outtake port 110, the plurality of processing modules 120 and the central transfer module 130 is sealed. Atmospheric controls, including filtering, provide an environment with extremely low levels of particulates and airborne molecular contamination ("AMC"). By creating a microenvironment within the semiconductor processing station 10, the processing modules 120 can be operated in a cleaner environment than the surrounding facilities. This allows tighter control of contaminates during substrate processing at reduced cost.

The load port 200 includes a load chamber 210 and a carrier transfer module 220 in the load chamber 210. The load chamber 210 communicates with the intake/outtake port 110 of the platform 100. The load chamber 210 has a load opening 212 at its top end 214 for receiving a transport carrier 300 within the load chamber 210. Furthermore, a movable cover 230 is disposed at the load opening 212 and can be configured to open or seal the load opening 212 of the load chamber 210. In some embodiments, the transport carrier 300 may be a front-opening unified pod ("FOUP"), a front-opening shipping box ("FOSB"), a standard mechanical interface ("SMIF") pod, and/or other suitable container. The transport carrier 300 can be loaded within the load chamber 210 through the load opening 212 at the top end 214 of the load chamber 210. Then, the carrier transfer module 220 can transfer the transport carrier 300 to the intake/outtake port 110. Herein, the position of the transport carrier 300 may be adjusted by the carrier transfer module 220 to effectively couple the transport carrier 300 to the intake/outtake port 110. For example, the transport carrier 300 may move in a specific distance and turns in a small angle to exactly face the intake/outtake port 110.

In some embodiments, the load opening 212 can be sealed by the movable cover 230 to form a vacuum environment for containing the transport carrier 300. A vacuum pump 240 may be disposed at the bottom end 216 of the load chamber to form the vacuum environment. The load chamber 210 together with the intake/outtake port 110 preserves the atmosphere within the central transfer module 130 and the processing modules 120 by separating them from the outside environment by sealing the load chamber 210.

In further other embodiments, the load chamber 210 is capable of creating an atmosphere compatible with outside environment or the central transfer chamber 14 depending on where the transport carrier 300 is scheduled to be next. This may require altering the gas content of the load chamber 210 by such mechanisms as adding purified gases or creating a vacuum, along with other suitable means for adjusting the load lock chamber atmosphere. When the correct atmosphere has been reached, the transport carrier 300 may be opened, and the substrates 12 in the transport carrier 300 can be accessed and transferred to the processing modules 120 by the central transfer module 130; alternatively, the transport carrier 300 with the processed substrates 12 may be removed from the load chamber 210 through the load opening 212.

In some embodiments, the central transfer module 130 communicates with the intake/outtake port 110 and the plurality of processing modules 120. A substrate transfer mechanism 132 is configured in the central transfer module 130 to pick up and traversely transfer the plurality of substrates 12 from the transport carrier 300 to the processing modules 120 in sequence. Furthermore, in some embodiments, the carrier transfer module 220 may include a carrier lift mechanism 222 configured to move the transport carrier 300 upward and downward in the load chamber 210. By this configuration, the carrier lift mechanism 222 may be configured to move the transport carrier 300 in a stepping movement synchronized with a pick up sequence of the substrate transfer mechanism 132. The transport carrier 300 is moved upward or downward in a pitch after one of the substrates 12 in the transport carrier 300 is picked up by the substrate transfer mechanism 132. And, the above step is repeated until all of the substrates 12 in the transport carrier 300 are picked up. Similarly, the processed substrates 12 can be loaded into the transport carrier 300 by reversing the above step.

Without additional load ports at sides of conventional equipment front end module (EFEM), the transport carrier 300 can be loaded into the sealed load chamber 210 directly through the load opening 212 at the top end 214 of the load chamber 210. Therefore, as compared with a conventional semiconductor processing station, the total footprint of the semiconductor processing station 10 is dramatically reduced, and tools of the semiconductor processing station 10 are less complicated so as to lower tool cost and increase tool throughput.

Referring to FIG. 2, in some embodiments, the semiconductor processing station 10 further comprises a carrier transport track 400 for transporting the transport carrier 300 outside the load chamber 210 and facilitates to load the transport carrier 300 into the load chamber 210. More specifically, the carrier transport track 400 has a top side 410 configured to load and move the transport carrier 300 and a bottom side 420 configured to drive the movable cover 230 to open the load chamber 210. Detailed operations of loading the transport carrier 300 accompanying with the carrier transport track 400 is further illustrated below.

FIG. 3 through FIG. 9 are schematic front views of the semiconductor processing station in FIG. 1 illustrating load process of the transport carrier according to some embodiments of the present disclosure.

Figure 3:
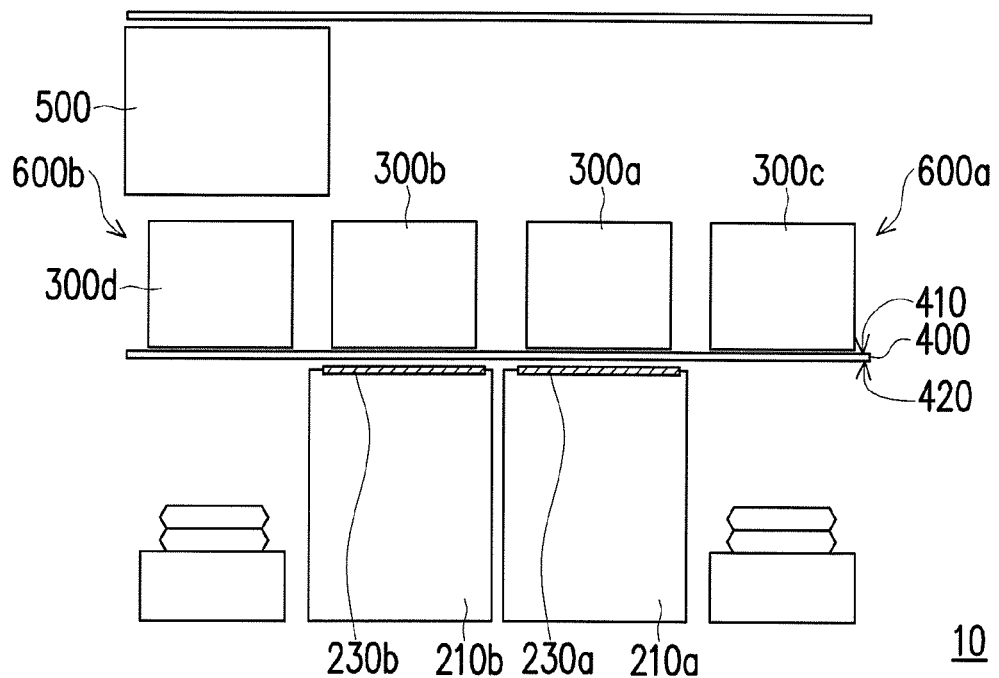
FIG. 3 through FIG. 9 are schematic front views of the semiconductor processing station in FIG. 1 illustrating load process of the transport carrier according to some embodiments of the present disclosure.

At first, as shown in FIG. 3, the load chamber 210 comprises a first load chamber 210a and a second load chamber 210b. The carrier transport track 400 is disposed over the first load chamber 210a and the second load chamber 210b. An automated material handling system (AMHS) 500 is used to transport the transport carrier 300 to the carrier transport track 400. Herein, transport carriers 300a and 300b with processed substrates are respectively removed from the first load chamber 210a and the second load chamber 210b to the top side 410 of the carrier transport track 400. In some embodiments, the semiconductor processing station 10 further comprises one or more buffer ports, such as a first buffer port 600a and a second buffer port 600b, disposed at sides of the first load chamber 210a and the second load chamber 210b and configured to evacuate the transport carriers 300a and 300b with processes substrates. Transport carriers 300c and 300d with unprocessed substrates are respectively loaded to the first buffer port 600a and the second buffer port 600b by the AMHS 500.

Figure 4:
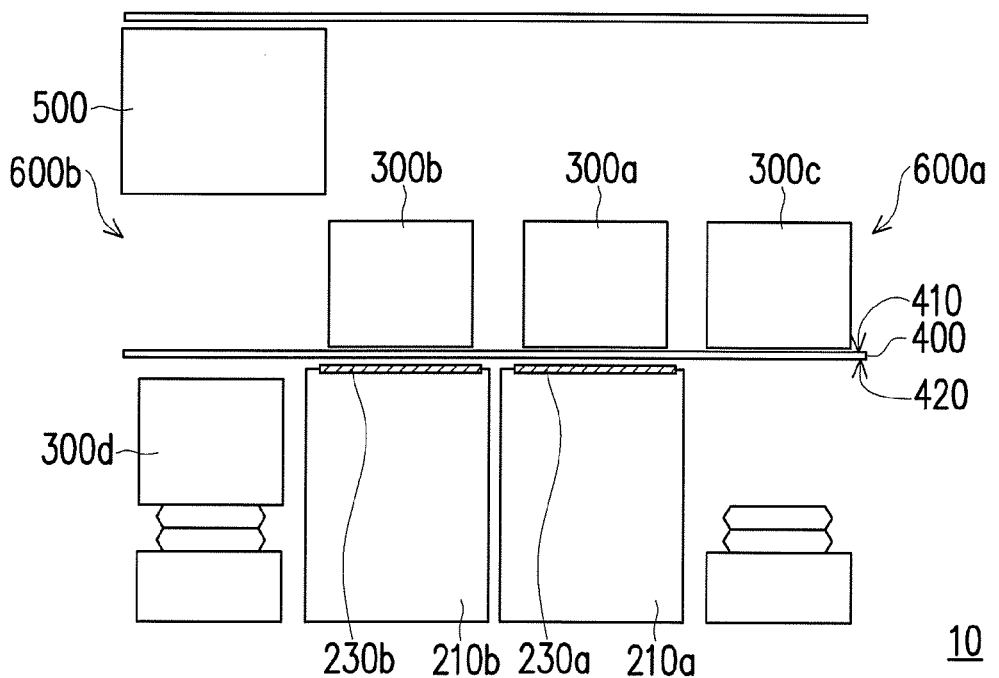

Then, as shown in FIG. 4, the transport carrier 300d with unprocessed substrates is moved into a buffer space of the second buffer port 600b from the top side 410 to the bottom side 420 of the carrier transport track 400. Therefore, the space original occupied by the transport carrier 300d with unprocessed substrates at the top side 410 of the carrier transport track 400 is released.

Figure 5:
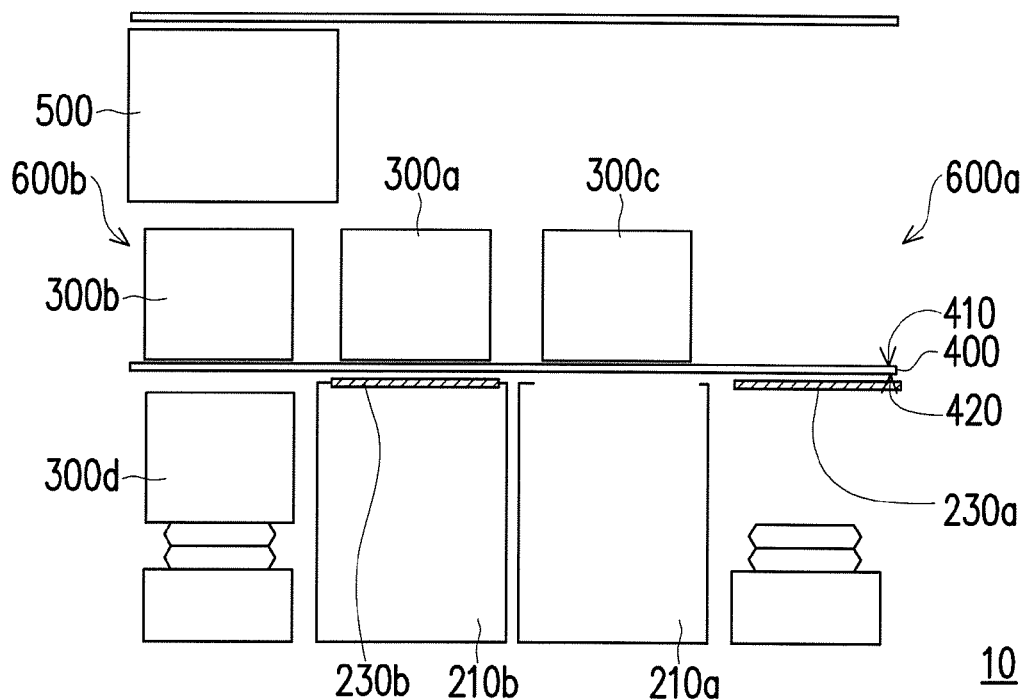

Then, as shown in FIG. 5, the transport carrier 300c with unprocessed substrates and the transport carriers 300a and 300b with processed substrates are moved left by the carrier transport track 400. At this time, the movable cover 230a of the first load chamber 210a is removed by the bottom side 420 of the carrier transport track 400 to open the first load chamber 210a by for example electrical magnetic force or other applicable manners. The transport carrier 300c with unprocessed substrates now is corresponding to the first load chamber 210a.

Figure 6:
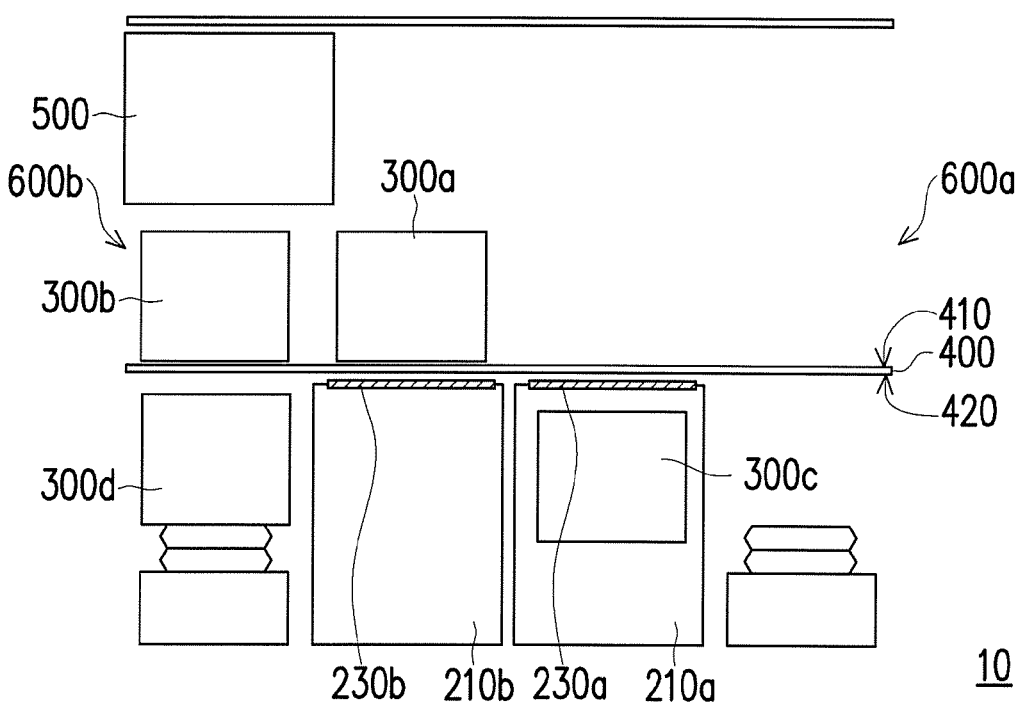

Next, as shown in FIG. 6, the transport carrier 300c with unprocessed substrates is loaded into the first load chamber 210a. And, the movable cover 230a returns back to seal the first load chamber 210a.

Figure 7:
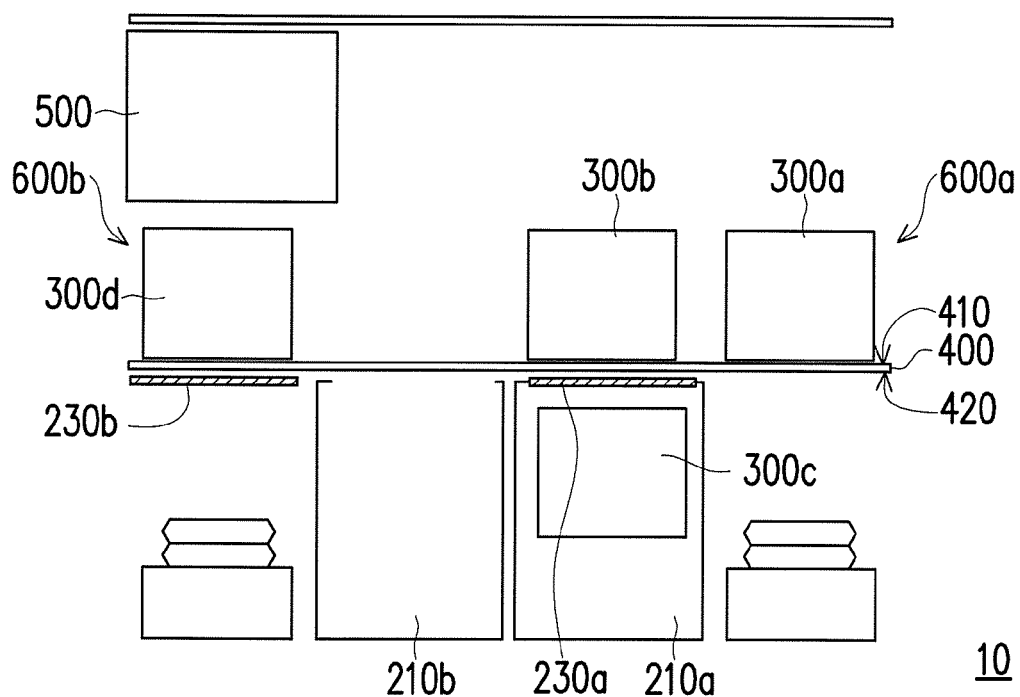

Then, as shown in FIG. 7, the transport carriers 300a and 300b with processed substrates are moved right by the carrier transport track 400. The space original occupied by the transport carriers 300b with processed substrates at the top side 410 of the carrier transport track 400 is released. At this time, the movable cover 230b of the second load chamber 210b is removed by the bottom side 420 of the carrier transport track 400 to open the second load chamber 210b by for example electrical magnetic force or other applicable manners. And, the transport carrier 300d with unprocessed substrates in the buffer space of the second buffer port 600b at the bottom side 420 of the carrier transport track 400 is now moved back to the top side 410 of the carrier transport track 400.

Figure 8:
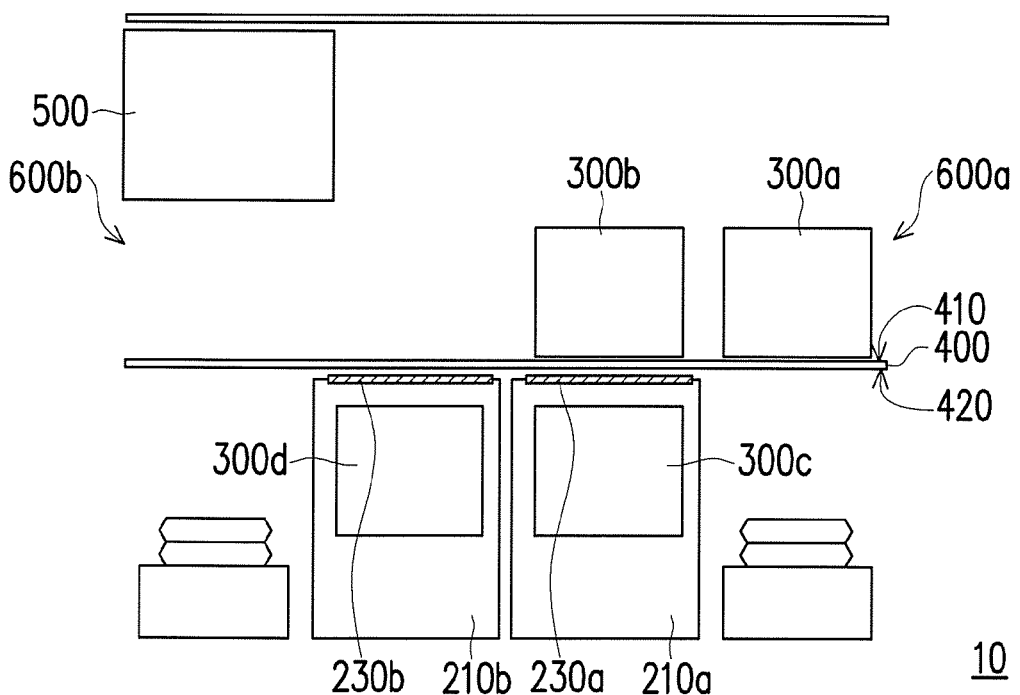

Thereafter, as shown in FIG. 8, the transport carrier 300d with unprocessed substrates now can be loaded into the second load chamber 210b. And then, the movable cover 230b returns back to seal the second load chamber 210b.

After the above steps of FIG. 3 through FIG. 8, the transport carriers 300c and 300d with unprocessed substrates are completely loaded into the sealed first load chamber 210a and the sealed second load chamber 210b. Then, the unprocessed substrates can be transferred by mechanisms of the platform 100 and the load port 200 to the processing modules 120 as mentioned in FIG. 1 and FIG. 2, to perform manufacturing procedures on the unprocessed substrates. In addition, the transport carriers 300a and 300b with processed substrates can be picked up and transported by the AMHS 500 away from the semiconductor processing station 10.

Figure 9:
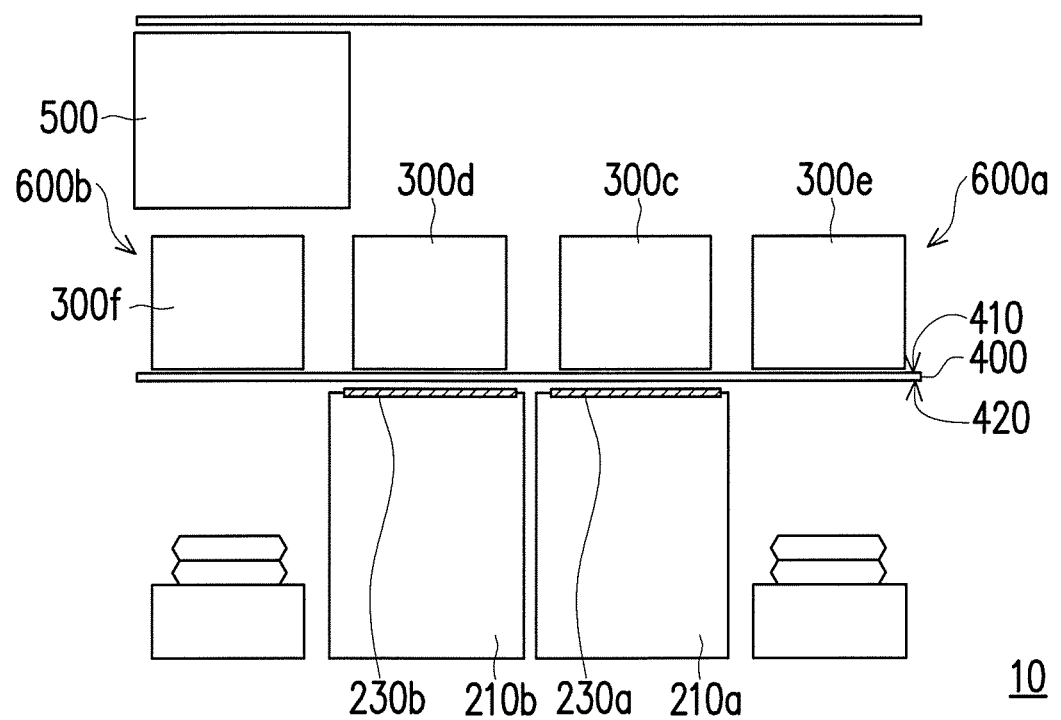

Furthermore, as shown in FIG. 9, after the substrates of the transport carriers 300c and 300d are processed, the transport carriers 300c and 300d with processed substrates are respectively removed from the first load chamber 210a and the second load chamber 210b to the top side 410 of the carrier transport track 400. And, transport carriers 300e and 300f with unprocessed substrates are respectively loaded to the first buffer port 600a and the second buffer port 600b by the AMHS 500. The process now is returned to the status as shown in FIG. 3. An automated carrier loading and transporting process complying with the operations of the platform 100 and the load port 200 can be accomplished by repeating the steps as shown in FIG. 3 through FIG. 9.

Accompanying with FIG. 1 through FIG. 9, methods of operating the semiconductor processing station 10 as mentioned above is further illustrated below. Detailed descriptions of the relevant components or steps can be referred to the aforementioned embodiments, and will not be repeated hereinafter.

Figure 10:
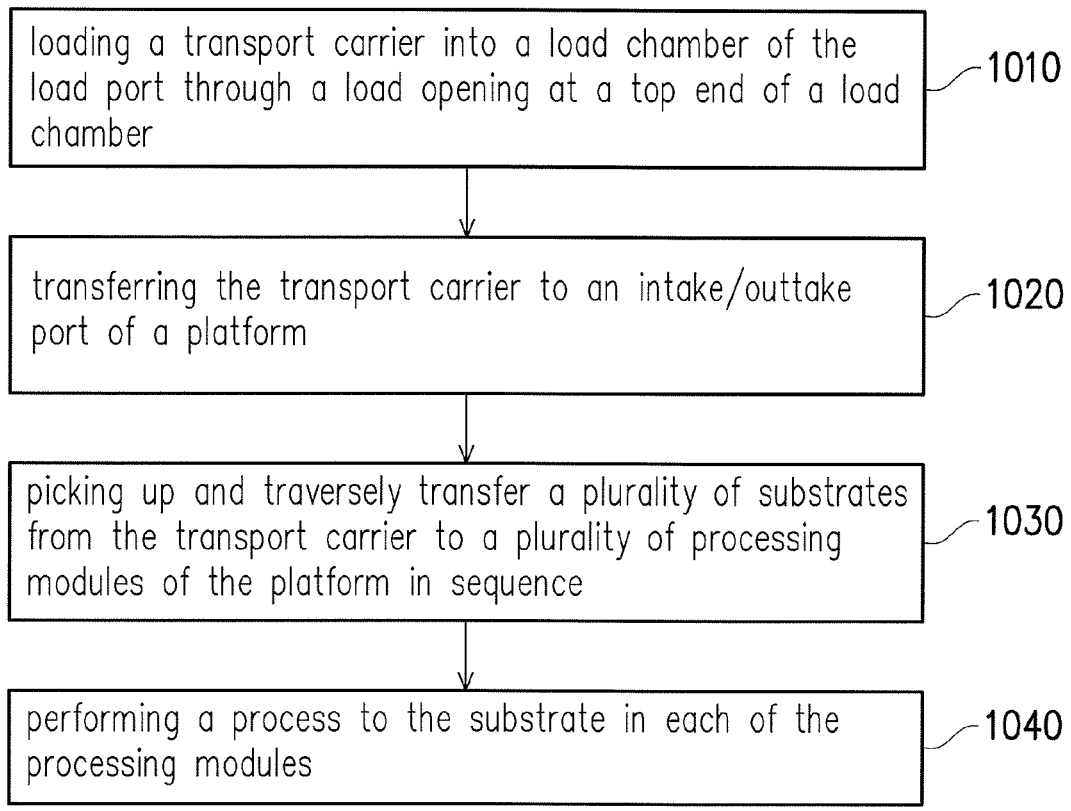
FIG. 10 is a flow chart showing the steps of a semiconductor process according to some embodiments of the present disclosure.

FIG. 10 is a flow chart showing the steps of a semiconductor process according to some embodiments of the present disclosure. At first, a transport carrier 300 loaded into a load chamber 210 of the load port 200 through a load opening 212 at a top end 214 of a load chamber 210 (Step 1010). Then, the transport carrier 300 is transferred to an intake/outtake port 110 of a platform 100 (Step 1020). Next, a plurality of substrates 12 in the transport carrier 300 are picked up and traversely transferred from the transport carrier 300 to a plurality of processing modules 120 of the platform 100 in sequence (Step 1030). Then, a process is performed to the substrate 12 in each of the processing modules (Step 1040).

The processing modules 120 may be configured to perform any manufacturing procedure on the substrate 12. Substrate manufacturing procedures include deposition processes such as physical vapor deposition ("PVD"), chemical vapor deposition ("CVD"), plasma-enhanced chemical vapor deposition ("PECVD"), electrochemical deposition ("ECD"), molecular beam epitaxy ("MBE"), atomic layer deposition ("ALD") and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the substrate 12; and/or any combination of procedures.

Figure 11:
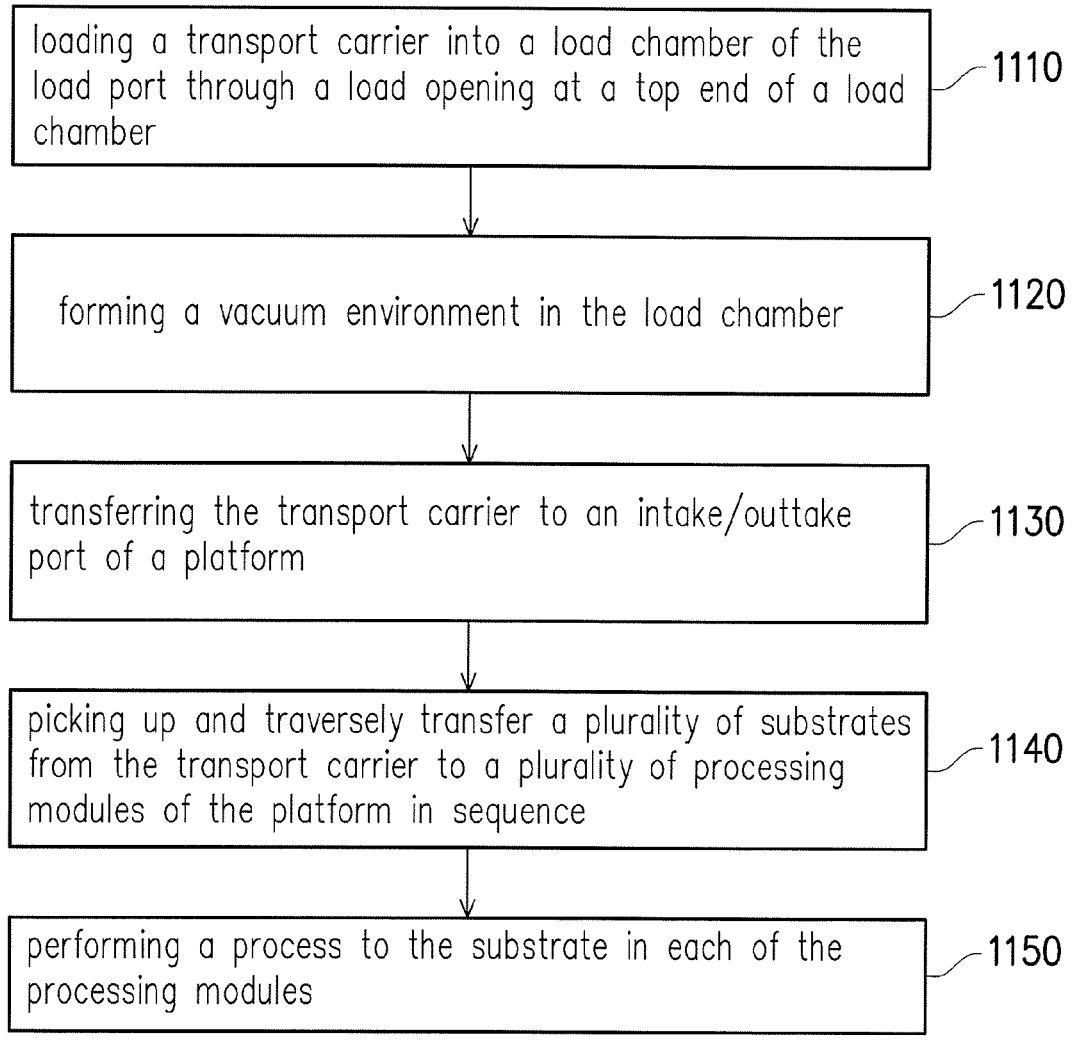
FIG. 11 is a flow chart showing the steps of a semiconductor process according to some embodiments of the present disclosure.

FIG. 11 is a flow chart showing the steps of a semiconductor process according to some embodiments of the present disclosure. At first, a transport carrier 300 loaded into a load chamber 210 of the load port 200 through a load opening 212 at a top end 214 of a load chamber 210 (Step 1110). Then, the load chamber 210 may be sealed by a movable cover 230 and a vacuum environment can be formed in the load chamber 210 (Step 1120). Then, the transport carrier 300 is transferred to an intake/outtake port 110 of a platform 100 by, for example, a carrier transfer module 220 configured in the load chamber 210 (Step 1130). Next, a plurality of substrates 12 in the transport carrier 300 are picked up and traversely transferred from the transport carrier 300 to a plurality of processing modules 120 of the platform 100 in sequence by, for example, a substrate transfer mechanism 132 configured in a central transfer module 130 communicating with the intake/outtake port 110 and the plurality of processing modules 120 of the platform 100 (Step 1140). Then, a process as mentioned above is performed to the substrate 12 in each of the processing modules (Step 1150).

Figure 12:
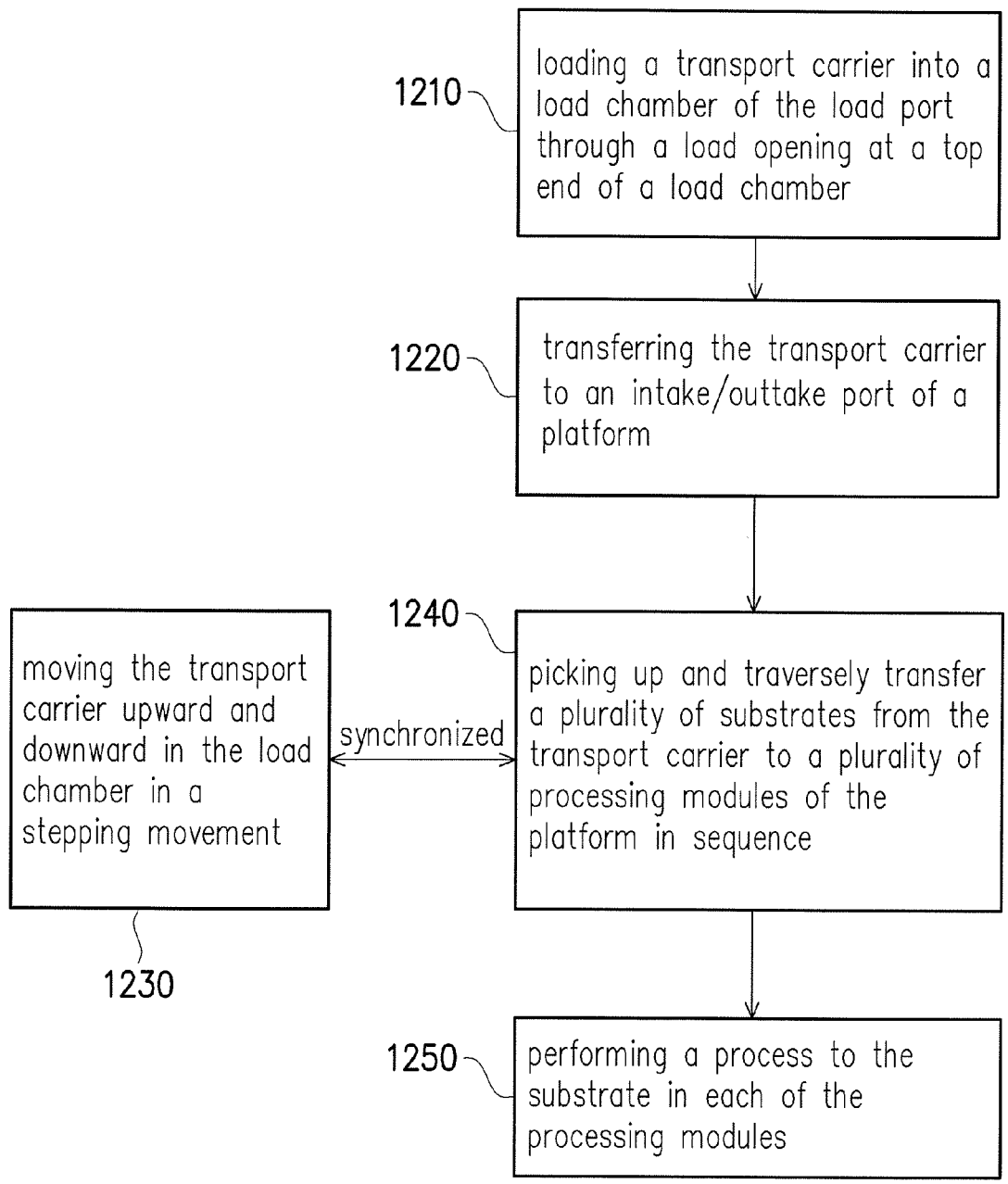
FIG. 12 is a flow chart showing the steps of a semiconductor process according to some embodiments of the present disclosure.

FIG. 12 is a flow chart showing the steps of a semiconductor process according to some embodiments of the present disclosure. At first, a transport carrier 300 loaded into a load chamber 210 of the load port 200 through a load opening 212 at a top end 214 of a load chamber 210 (Step 1210). Then, the transport carrier 300 is transferred to an intake/outtake port 110 of a platform 100 by, for example, a carrier transfer module 220 configured in the load chamber 210 (Step 1220). Next, the transport carrier 300 may be moved upward and downward in the load chamber 210 in a stepping movement by the carrier transfer module 220 (Step 1230). And, at the same time, a plurality of substrates 12 in the transport carrier 300 are picked up and traversely transferred from the transport carrier 300 to a plurality of processing modules 120 of the platform 100 in sequence synchronized with the step movement of the transport carrier 300 by, for example, a substrate transfer mechanism 132 configured in a central transfer module 130 communicating with the intake/outtake port 110 and the plurality of processing modules 120 of the platform 100 (Step 1240). Then, a process as mentioned above is platform to the substrate 12 in each of the processing modules (Step 1250).

Figure 13:
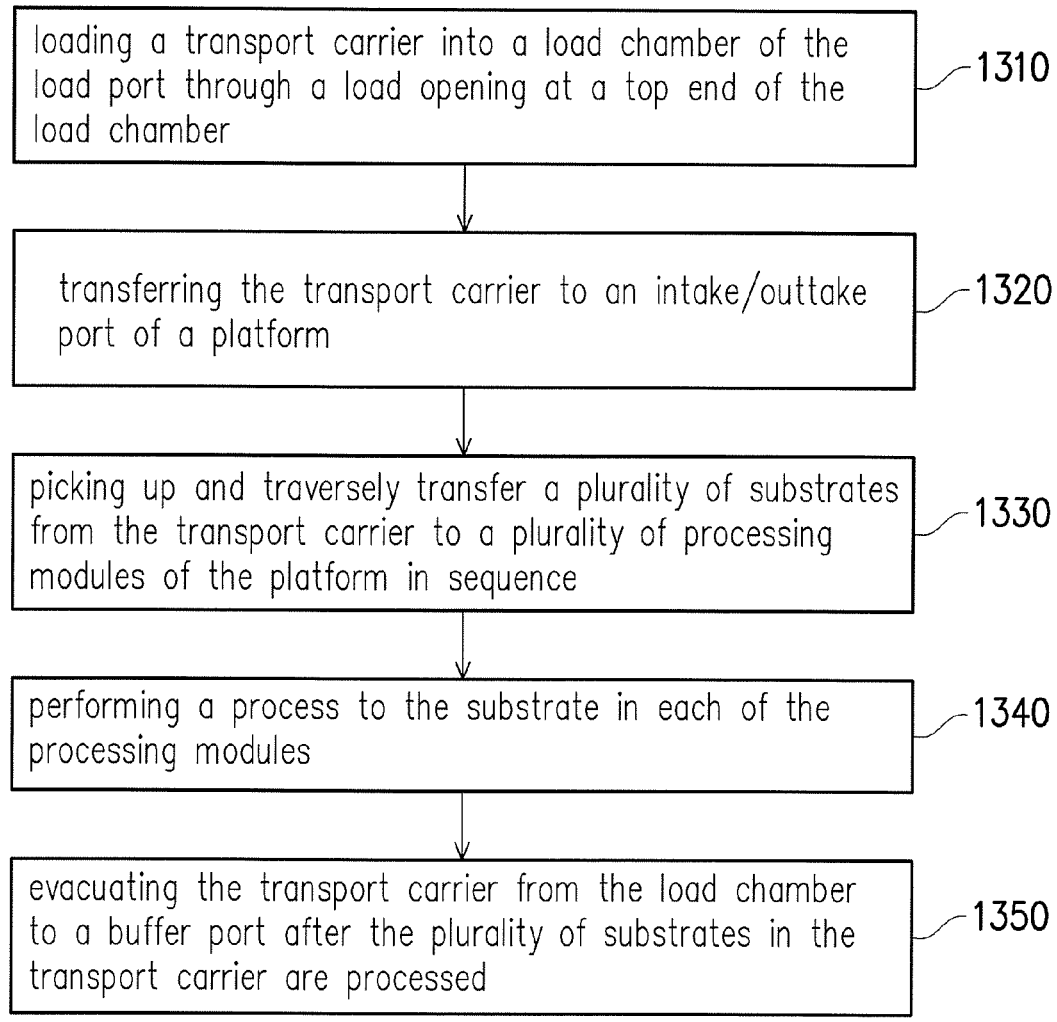
FIG. 13 is a flow chart showing the steps of a semiconductor process according to some embodiments of the present disclosure.

FIG. 13 is a flow chart showing the steps of a semiconductor process according to some embodiments of the present disclosure. At first, a transport carrier 300 loaded into a load chamber 210 of the load port 200 through a load opening 212 at a top end 214 of a load chamber 210 (Step 1310). Then, the transport carrier 300 is transferred to an intake/outtake port 110 of a platform 100 (Step 1320). Next, a plurality of substrates 12 in the transport carrier 300 are picked up and traversely transferred from the transport carrier 300 to a plurality of processing modules 120 of the platform 100 in sequence (Step 1330). Then, a process as mentioned above is performed to the substrate 12 in each of the processing modules (Step 1340). Herein, the step 1310 of loading the transport carrier 300 into the load chamber 210 may be performed by a carrier transport track 400 having a top side 410 configured to load and move the transport carrier 300 and a bottom side 420 configured to open the load chamber 210. Then, the transport carrier 300 may be evacuated from the load chamber 210 to a buffer port 600a or 600b after the plurality of substrates 12 in the transport carrier 300 are processed (Step 1350). And, in Step 1350, the load chamber 210 may be opened as the transport carrier 300 is evacuated from the load chamber 210 to the buffer port 600a or 600b.

Figure 14:
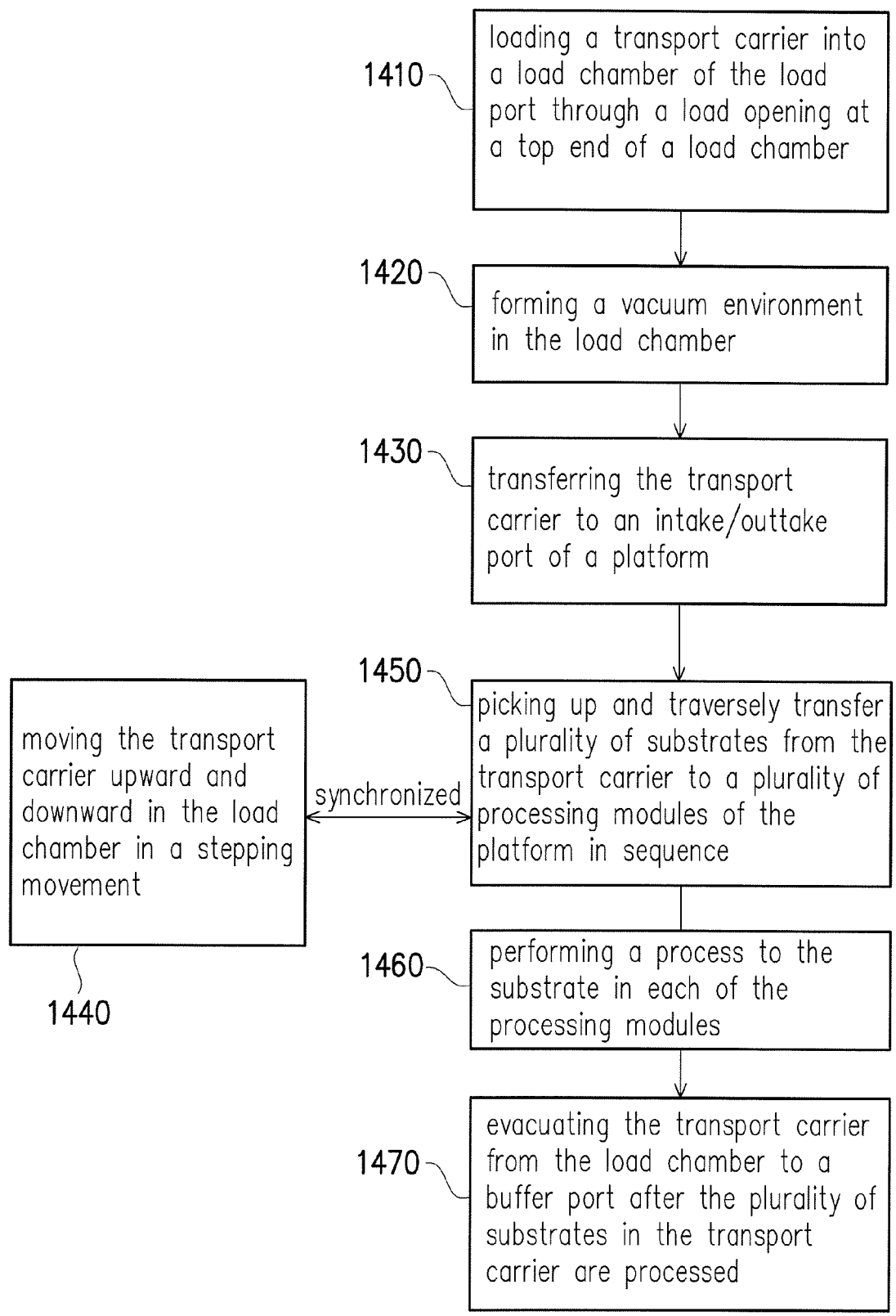
FIG. 14 is a flow chart showing the steps of a semiconductor process according to some embodiments of the present disclosure.

FIG. 14 is a flow chart showing the steps of a semiconductor process according to some embodiments of the present disclosure. At first, a transport carrier 300 loaded into a load chamber 210 of the load port 200 through a load opening 212 at a top end 214 of a load chamber 210 (Step 1410). Then, the load chamber 210 may be sealed by a movable cover 230 and a vacuum environment can be formed in the load chamber 210 (Step 1420). Then, the transport carrier 300 is transferred to an intake/outtake port 110 of a platform 100 by, for example, a carrier transfer module 220 configured in the load chamber 210 (Step 1430). Next, the transport carrier 300 may be moved upward and downward in the load chamber 210 in a stepping movement by the carrier transfer module 220 (Step 1440). And, at the same time, a plurality of substrates 12 in the transport carrier 300 are picked up and traversely transferred from the transport carrier 300 to a plurality of processing modules 120 of the platform 100 in sequence synchronized with the step movement of the transport carrier 300 by, for example, a substrate transfer mechanism 132 configured in a central transfer module 130 communicating with the intake/outtake port 110 and the plurality of processing modules 120 of the platform 100 (Step 1450). Then, a process as mentioned above is performed to the substrate 12 in each of the processing modules (Step 1460). Herein, the step 1310 of loading the transport carrier 300 into the load chamber 210 may be performed by a carrier transport track 400 having a top side 410 configured to load and move the transport carrier 300 and a bottom side 420 configured to open the load chamber 210. Then, the transport carrier 300 may be evacuated from the load chamber 210 to a buffer port 600a or 600b after the plurality of substrates 12 in the transport carrier 300 are processed (Step 1470). And, in Step 1470, the load chamber 210 may be opened as the transport carrier 300 is evacuated from the load chamber 210 to the buffer port 600a or 600b.

According to some embodiments, a semiconductor processing station comprises a platform and a load port, wherein the platform includes an intake/outtake port and a plurality of processing modules. The load port includes a load chamber, a movable cover and a carrier transfer module. The load chamber communicates with the intake/outtake port and has a load opening at its top end for receiving a transport carrier within the load chamber. The movable cover is disposed at the load opening and is configured to seal the load opening. The carrier transfer module is configured to transfer the transport carrier to the intake/outtake port.

According to some embodiments, a semiconductor process suitable for a semiconductor processing station having a platform and a load port is provided, wherein the semiconductor process comprises: loading a transport carrier carrying a plurality of substrates into a load chamber of the load port through a load opening at a top end of the load chamber; transferring the transport carrier to an intake/outtake port of the platform; picking up and traversely transfer the plurality of substrates from the transport carrier to a plurality of processing modules of the platform in sequence; and, performing a process to the substrate in each of the processing modules.

According to some embodiments, a method of operating a semiconductor processing station having a platform and a load port is provided, wherein the method comprises: loading a transport carrier into a load chamber of the load port through a load opening at a top end of the load chamber; transferring the transport carrier to an intake/outtake port of the platform; and, picking up and traversely transfer a plurality of substrates from the transport carrier to a plurality of processing modules of the platform in sequence.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process for a semiconductor processing station having a platform and a load port, the semiconductor process comprising:
   loading a transport carrier carrying a plurality of substrates into a load chamber of the load port through a load opening at the top end of the load chamber, wherein the transport carrier is loaded into the load chamber by a carrier transport track having a bottom side configured to open the load chamber;
   transferring the transport carrier to an intake/outtake port of the platform;
   picking up and traversely transferring the plurality of substrates from the transport carrier to a plurality of processing modules of the platform in sequence; and
   processing the substrate in each of the processing modules.

2. The semiconductor process of claim 1, further comprising sealing the load chamber and forming a vacuum environment in the load chamber after loading the transport carrier into the load chamber and before transferring the transport carrier to the intake/outtake port of the platform.

3. The semiconductor process of claim 1, wherein the plurality of substrates are picked up and traversely transferred from the transport carrier to the plurality of processing modules of the platform by a substrate transfer mechanism configured in a central transfer module communicating with the intake/outtake port and the plurality of processing modules of the platform.

4. The semiconductor process of claim 1, wherein loading the transport carrier into the load chamber comprises moving the transport carrier upward and downward in the load chamber.

5. The semiconductor process of claim 4, wherein the transport carrier is moved upward and downward in the load chamber in a stepping movement synchronized with a sequence of picking up and traversely transferring the plurality of substrates from the transport carrier to the plurality of processing modules.

6. The semiconductor process of claim 1, wherein the carrier transport track further has a top side configured to load and move the transport carrier.

7. The semiconductor process of claim 1, further comprising providing a buffer port disposed at a side of the load chamber and evacuating the transport carrier from the load chamber to the buffer port after the plurality of substrates in the transport carrier are processed.

8. The semiconductor process of claim 1, wherein the load chamber is opened as the transport carrier is evacuated from the load chamber to the buffer port.

9. A semiconductor process for a semiconductor processing station having a platform and a load port, the semiconductor process comprising:
    loading a transport carrier into a load chamber of the load port through a load opening at the top end of the load chamber, wherein the transport carrier is loaded into the load chamber by a carrier transport track having a bottom side configured to open the load chamber;
    transferring the transport carrier to an intake/outtake port of the platform; and
    picking up and traversely transferring a plurality of substrates from the transport carrier to a plurality of processing modules of the platform in sequence.

10. The semiconductor process of claim 9, wherein the plurality of substrates are picked up and traversely transferred from the transport carrier to the plurality of processing modules of the platform by a substrate transfer mechanism configured in a central transfer module communicating with the intake/outtake port and the plurality of processing modules of the platform.

11. The semiconductor process of claim 9, wherein loading the transport carrier into the load chamber comprises moving the transport carrier upward and downward in the load chamber in a stepping movement synchronized with a sequence of picking up and traversely transferring the plurality of substrates from the transport carrier to the plurality of processing modules.

12. The semiconductor process of claim 9, wherein the carrier transport track further has a top side configured to load and move the transport carrier.

13. The semiconductor process of claim 9, further comprising providing a buffer port disposed at a side of the load chamber and evacuating the transport carrier from the load chamber to the buffer port after the plurality of substrates in the transport carrier are processed.

14. A semiconductor process for a semiconductor processing station having a platform and a load port, the semiconductor process comprising:
    loading a transport carrier carrying a plurality of substrates into a load chamber of the load port through a load opening at the top end of the load chamber, wherein the transport carrier is loaded into the load chamber by a carrier transport track having a top side configured to load and move the transport carrier and a bottom side configured to open the load chamber;
    transferring the transport carrier to an intake/outtake port of the platform;
    picking up and traversely transferring the plurality of substrates from the transport carrier to a plurality of processing modules of the platform in sequence;
    processing the substrate in each of the processing modules; and
    evacuating the transport carrier from the top end of the load chamber to a buffer port after the plurality of substrates in the transport carrier are processed.

15. The semiconductor process of claim 14, wherein the load chamber is opened as the transport carrier is evacuated from the load chamber to the buffer port.

16. The semiconductor process of claim 14, further comprising sealing the load chamber and forming a vacuum environment in the load chamber after loading the transport carrier into the load chamber and before transferring the transport carrier to the intake/outtake port of the platform.

17. The semiconductor process of claim 14, wherein the plurality of substrates are picked up and traversely transferred from the transport carrier to the plurality of processing modules of the platform by a substrate transfer mechanism configured in a central transfer module communicating with the intake/outtake port and the plurality of processing modules of the platform.

18. The semiconductor process of claim 14, wherein loading the transport carrier into the load chamber comprises moving the transport carrier upward and downward in the load chamber.

19. The semiconductor process of claim 18, wherein the transport carrier is moved upward and downward in the load chamber in a stepping movement synchronized with a sequence of picking up and traversely transferring the plurality of substrates from the transport carrier to the plurality of processing modules.

20. The semiconductor process of claim 14, wherein the bottom side opens the load chamber by electrical magnetic force.

* * * * *